United States Patent
Lakshmikumar et al.

(10) Patent No.: US 9,654,061 B2
(45) Date of Patent: May 16, 2017

(54) SILICON PHOTONICS MODULATOR DRIVER

(71) Applicant: Cisco Technology, Inc., San Jose, CA (US)

(72) Inventors: Kadaba Lakshmikumar, Basking Ridge, NJ (US); Craig Appel, Macugie, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/698,974

(22) Filed: Apr. 29, 2015

(65) Prior Publication Data

US 2016/0112016 A1 Apr. 21, 2016

Related U.S. Application Data

(60) Provisional application No. 62/066,128, filed on Oct. 20, 2014.

(51) Int. Cl.
*H03F 3/45* (2006.01)
*H03F 3/08* (2006.01)
(Continued)

(52) U.S. Cl.
CPC ............. *H03F 3/08* (2013.01); *H03F 1/0205* (2013.01); *H03F 1/086* (2013.01);
(Continued)

(58) Field of Classification Search
CPC .................................................. H03F 3/45183
(Continued)

(56) References Cited

U.S. PATENT DOCUMENTS

| 6,046,638 A | 4/2000 | Hogeboom |
| 2009/0295481 A1 | 12/2009 | Lin et al. |
| 2012/0139610 A1* | 6/2012 | Putter ................. H03F 3/45632 327/337 |

OTHER PUBLICATIONS

Henzler et al., "A Local Passive Time Interpolation Concept for Variation-Tolerant High-Resolution Time-to-Digital Conversion," IEEE Journal of Solid-State Circuits, Jul. 2008, vol. 43, No. 7, pp. 1666-1676.

(Continued)

*Primary Examiner* — Khanh V Nguyen
*Assistant Examiner* — Khiem Nguyen
(74) *Attorney, Agent, or Firm* — Patterson + Sheridan LLP

(57) ABSTRACT

Embodiments generally relate to a conversion arrangement, a driver arrangement, and a method of producing a complementary complementary metal-oxide-semiconductor (CMOS) output signal for driving a modulator device. The conversion arrangement includes a differential amplifier configured to produce a first amplified signal based on the differential input signal, and at least two transimpedance amplifiers (TIAs) coupled with respective outputs of the differential amplifier and configured to produce a second amplified signal based on the first amplified signal. Respective bias voltages for the TIAs are based on the first amplified signal. The conversion arrangement further includes a common-mode feedback arrangement coupled with outputs of the TIAs and configured to control the first amplified signal based on the second amplified signal, thereby controlling the bias voltages, wherein the complementary CMOS output signal is based on the second amplified signal.

19 Claims, 8 Drawing Sheets

(51) Int. Cl.
  *H03F 1/02* (2006.01)
  *H03F 1/08* (2006.01)
(52) U.S. Cl.
  CPC ..... *H03F 3/45076* (2013.01); *H03F 3/45183* (2013.01); *H03F 3/45659* (2013.01); *H03F 2200/135* (2013.01); *H03F 2200/75* (2013.01); *H03F 2203/45026* (2013.01); *H03F 2203/45082* (2013.01); *H03F 2203/45088* (2013.01); *H03F 2203/45116* (2013.01); *H03F 2203/45208* (2013.01); *H03F 2203/45221* (2013.01); *H03F 2203/45336* (2013.01); *H03F 2203/45402* (2013.01); *H03F 2203/45418* (2013.01); *H03F 2203/45434* (2013.01); *H03F 2203/45436* (2013.01); *H03F 2203/45481* (2013.01); *H03F 2203/45594* (2013.01); *H03F 2203/45604* (2013.01); *H03F 2203/45642* (2013.01); *H03F 2203/45648* (2013.01); *H03F 2203/45664* (2013.01)
(58) Field of Classification Search
  USPC .................................................. 330/253, 258
  See application file for complete search history.

(56) References Cited

OTHER PUBLICATIONS

European Patent Office, International Application No. PCT/US2015/055793, International Search Report and Written Opinion dated Dec. 18, 2015, 15 pages.
Liu et al.: "The Design of a High Speed Low Power Phase Locked Loop", Topical Workshop on Electronics for Particle Physics (TWEPP-09), Paris, France, Sep. 21-25, 2009, pp. 476-480.
Sanjay Kumar Wadhwa: "Design of a Low Power High Speed Differential to Single Ended Converter Using Feedback", Embedded: cracking the code to systems development, Mar. 4, 2013. <http://www.embedded.com/design/power-optimization/4408179/1/Design-of-a-low-power-high-speed-differential-to-single-ended-converter-using-feedback->, 4 pages.
Huaide Wang et al.: "A 21-Gb/s 87-mW Transceiver with FFE/DFE/Analog Equalizer in 65-nm CMOS Technology", IEEE Journal of Solid-State Circuits, vol. 45, No. 4, Apr. 2010, pp. 909-920.
Liu: Lecture 23, EE105 Fall 2007, University of California—Berkeley, Fall 2007. <http://www-inst.eecs.berkeley.edu/~ee105/fa07/lectures/Lecture%2023.ppt>, 16 pages.

\* cited by examiner

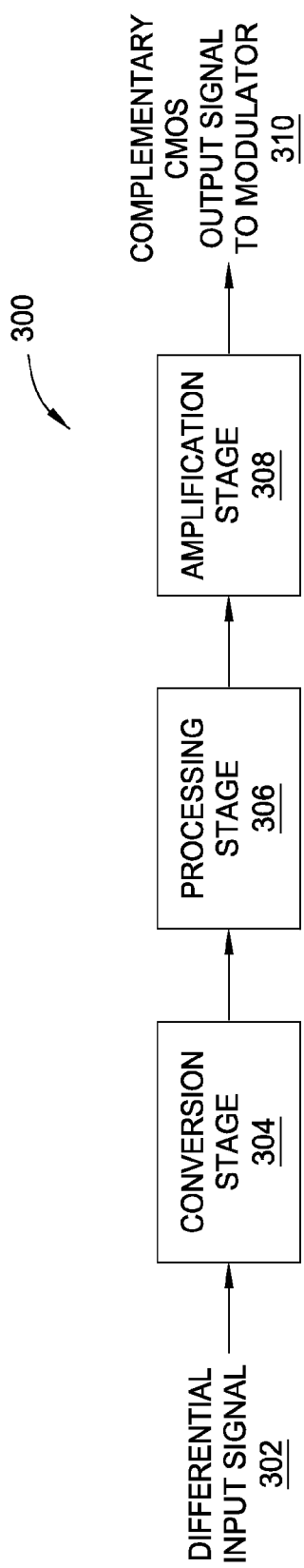
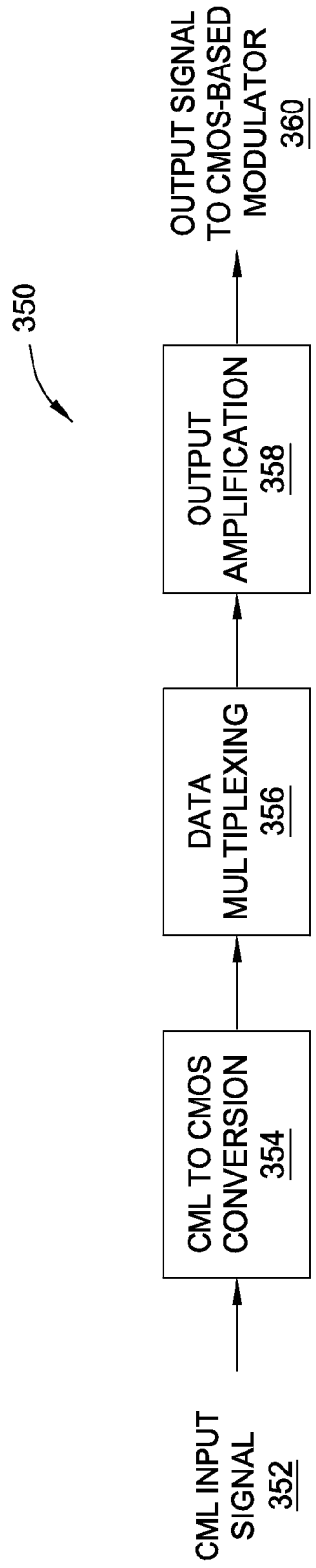
FIG. 3A
FIG. 3B

SILICON PHOTONICS MODULATOR DRIVER

CROSS-REFERENCE TO RELATED APPLICATIONS

This application claims benefit of U.S. provisional patent application Ser. No. 62/066,128, filed Oct. 20, 2014, entitled "Silicon Photonics Modulator Driver," which is herein incorporated by reference.

TECHNICAL FIELD

Embodiments presented in this disclosure generally relate to optical modulation and, more specifically, to driver arrangements for optical modulator devices.

BACKGROUND

Many electro-optic devices exploit the free carrier dispersion effect to alter both the real and imaginary parts of the refractive index. This exploitation is used since the unstrained pure crystalline silicon does not exhibit a linear electro-optic (Pockels) effect, and the refractive index changes caused by the Franz-Keldysh effect and Kerr effect are very weak. Phase modulation in a specific region of optical devices, such as Mach-Zehnder modulators, total-internal-reflection (TIR)-based structures, cross switches, Y-switches, ring resonators, and Fabry-Perot resonators may be used to modulate the output intensity.

Free carrier concentration in electro-optic devices can be varied by injection, accumulation, depletion, or inversion of carriers. Most of the devices investigated to date exhibit some common features, such as requiring long interaction lengths (for example, 5-10 mm) and injection current densities higher than 1 $kA/cm^3$ in order to obtain a significant modulation depth.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A and 3B are block diagrams of exemplary modulator drivers, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
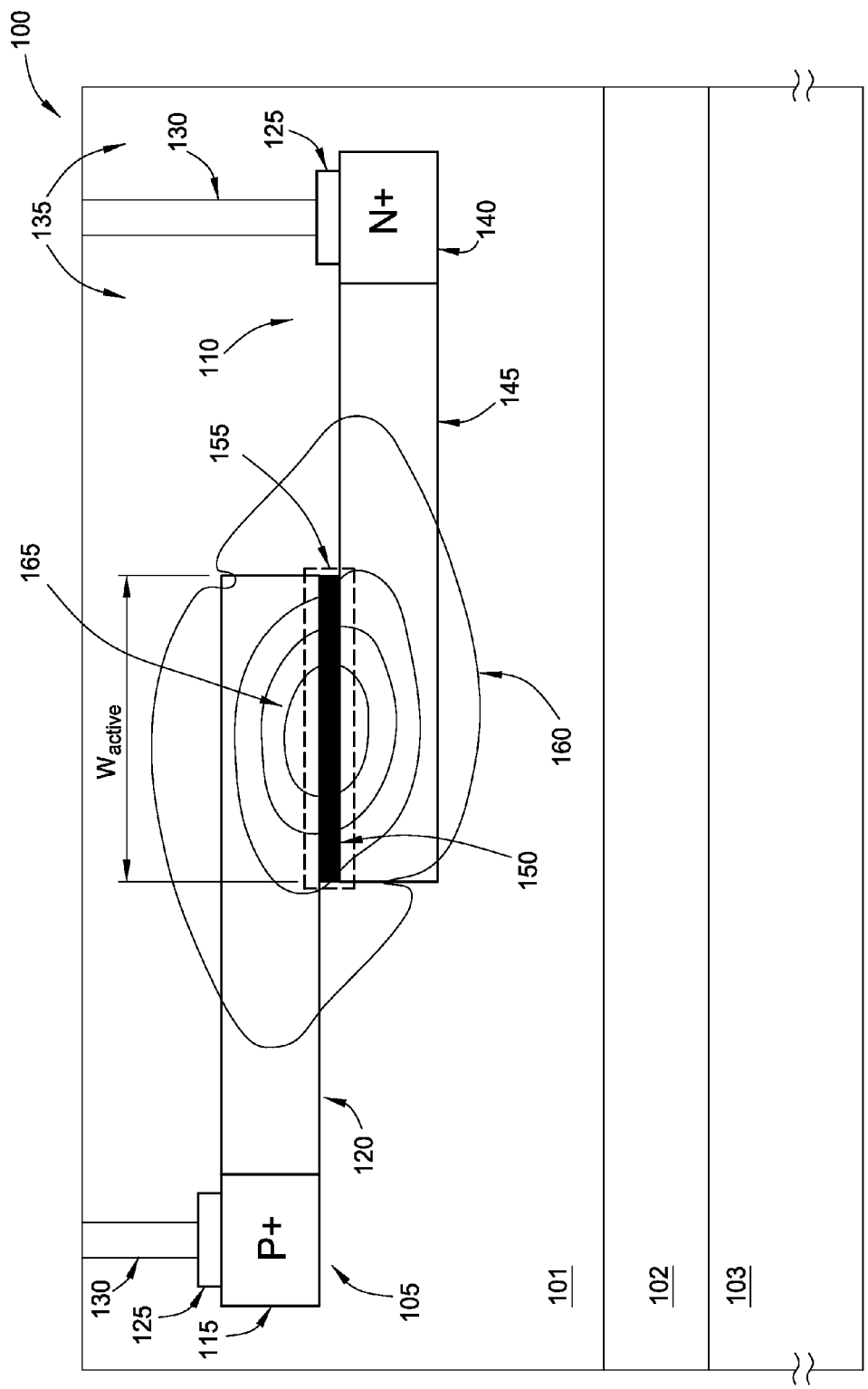
FIG. 1 illustrates a cross-sectional view of a silicon-on-insulator (SOI) electro-optic modulator device, according to embodiments described herein.

One embodiment presented in this disclosure is a conversion arrangement for converting a differential input signal to a complementary complementary metal-oxide-semiconductor (CMOS) output signal. The conversion arrangement includes a differential amplifier configured to produce a first amplified signal based on the differential input signal, and at least two transimpedance amplifiers (TIAs) coupled with respective differential outputs of the differential amplifier and configured to produce a second amplified signal based on the first amplified signal. Respective bias voltages for the TIAs are based on the first amplified signal. The conversion arrangement also includes a common-mode feedback arrangement coupled with outputs of the TIAs and configured to control the first amplified signal based on the second amplified signal, thereby controlling the bias voltages. The complementary CMOS output signal is based on the second amplified signal.

Another embodiment is a driver arrangement configured to receive a differential input signal and to produce a complementary CMOS output signal for driving a modulator device. The driver arrangement includes a conversion arrangement that is configured to amplify, at a differential amplification stage, the differential input signal to produce a first amplified signal, and to amplify, using at least two transimpedance amplifiers (TIAs) coupled with respective differential outputs of the differential amplification stage, the first amplified signal to produce a second amplified signal. Respective bias voltages for the TIAs are based on the first amplified signal. The conversion arrangement is further configured to produce, based on the second amplified signal and using a feedback arrangement coupled with the differential amplification stage, a control signal for the differential amplification stage. Application of the control signal to the differential amplification stage operates to control the bias voltages for the TIAs.

Another embodiment is a method of producing a complementary CMOS output signal for driving a modulator device. The method includes receiving a differential input signal, amplifying, using a differential amplifier, the differential input signal to produce a first amplified signal, and amplifying, using transimpedance amplifiers (TIAs) coupled with respective outputs of the differential amplifier, the first amplified signal to produce a second amplified signal. Respective bias voltages for the TIAs are based on the first amplified signal. The method further includes producing, based on the second amplified signal and using a feedback arrangement coupled with the differential amplifier, a control signal for the differential amplifier, and applying the control signal to the differential amplifier, thereby controlling the bias voltages for the TIAs. The complementary CMOS output signal is based on the second amplified signal.

Example Embodiments

Embodiments presented in this disclosure generally relate to optical modulation and, more specifically, to driver arrangements for optical modulator devices. Many small and low-power electronic devices communicate using standards that are based on current-mode logic (CML) or other differential signaling techniques. Some commonly-used examples of these standards include RS-232, RS-422, RS-485, Ethernet over twisted pair, PCI Express, DisplayPort, HDMI, USB, and so forth. In order to drive modulation circuitry using the data transmitted by differential signaling, the data signal typically requires amplification to meet the input requirements for the modulator.

Distributed amplifier topologies provide one amplification solution, but may not be ideal for several reasons. The circuitry for distributed amplifiers requires a significant amount of area. The single-ended output of a distributed amplifier provides only a limited voltage swing when compared with other topologies. Modeling the network of a distributed amplifier and matching it to a modulator circuit can be relatively complex. Distributed amplifiers also consume a substantial amount of power—transistors are often biased in class-A mode and significant headroom is required to keep the transistors operating within the linear mode.

On the other hand, CML amplifier topologies can provide approximately twice the voltage swing of single-ended amplifiers. However, CML amplifiers are also biased in class-A mode, requiring a large bias current, and the voltage swing on the output is still only a fraction of the supply voltage. Power consumption is also affected by other circuit parameters required to support high-speed modulation. For example, in order to drive high-speed data using a Mach-Zender Interferometer (MZI) modulator having a capacitance on the order of 2 picofarads (pF), the load resistances of a CML amplifier must be very small to provide a suitably small time constant. However, selecting such small resistances results in a larger amount of current required for a particular voltage value. Thus, the power dissipation of CML amplifier topologies is also substantially large.

According to various embodiments disclosed herein, CMOS based inverter amplifiers are used within modulator driver arrangements. CMOS inverter amplifier topologies offer several benefits when compared with distributed or CML amplifier topologies, such as a very small power dissipation, a high-gain bandwidth, and a rail-to-rail drive capability. These properties make CMOS-based inverter amplifiers particularly well-suited for driving MOS-capacitor optical modulators, whose compact size and high efficiency allow the modulator to be accurately modeled as a lumped element. In some embodiments, a differential front-end of the driver arrangement is used to preserve desirable small-signal gain/bandwidth benefits, while subsequent inverters (e.g., transimpedance amplifiers) within the driver arrangement are biased at their trip point (i.e., at threshold voltage $V_{th}$) to preserve a desired large-signal drive capability. In some embodiments, control of the inverter biasing is accomplished using a common-mode feedback arrangement coupled with the output of the inverters and with current source loads of the differential front-end.

FIG. 1 illustrates a cross-sectional view of a silicon-on-insulator (SOI) electro-optic modulation device, according to embodiments described herein. Modulation device 100 includes a surface layer 101, a buried insulation layer 102 (also referred to as buried oxide (BOX) layer), and a semiconductor substrate 103. Although the embodiments herein refer to the surface layer 101 and substrate 103 as silicon, the disclosure is not limited to such. For example, other semiconductors or optically transmissive materials may be used to form the structure of modulation device 100 shown here. Moreover, the surface layer 101 and the substrate 103 may be made of the same material, but in other embodiments, these layers 101, 103 may be made from different materials.

The thickness of the surface layer 101 may range from less than 100 nanometers to greater than a micron. More specifically, the surface layer 101 may be between 100-300 nanometers thick. The thickness of the insulation layer 102 may vary depending on the desired application. The thickness of the insulation layer 102 may directly depend on the size of the mode being coupled to the modulation device 100 and the desired efficiency. As such, the thickness of insulation layer 102 may range from less than one micron to tens of microns. The thickness of the substrate 103 may vary widely depending on the specific application of the modulation device 100. For example, the substrate 103 may be the thickness of a typical semiconductor wafer (e.g., 100-700 microns) or may be thinned and mounted on another substrate.

For optical applications, the silicon surface layer 101 and insulation layer 102 (e.g., silicon dioxide, silicon nitride, and the like) may provide contrasting refractive indexes that vertically confine an optical signal in a waveguide in the surface layer 101. In a later processing step, the surface layer 101 of the modulator device 100 may be etched to form one or more silicon waveguides. Because silicon has a high refractive index compared to an insulator such as silicon dioxide, the optical signal remains primarily in the waveguide as it propagates across the surface layer 101.

Modulation device 100 may include an upper silicon region 105 doped with a first conductivity type (e.g., P-type) that is spaced apart from a lower silicon region 110 doped with a second, different conductivity type (e.g., N-type) by a gate dielectric layer 150. The arrangement of the upper region 105, gate dielectric layer 150, and lower region 110 forms a silicon-insulator-silicon capacitor (also referred to as SISCAP) guide that provides efficient, high-speed optical modulation of an optical signal passing through the modulation device 100. Specifically, FIG. 1 represents a cross-section of the SISCAP structure in which the optical signal travels in a direction projecting into, or out of, the page. FIG. 1 illustrates the confinement of the optical mode 160 of the optical signal by the insulation layer 102 and the dielectric material 135 (e.g., silicon dioxide or silicon nitride) surrounding the regions 105 and 110. Moreover, the thicknesses and widths of the regions 105 and 110 may be selected in order to aid the confinement of the optical mode. For example, the intensity of the optical mode 160 may generally increase when approaching a center 165 of the optical mode. Through selecting properties of the regions 105 and 110, the more intense portions of the optical mode may be shaped or better confined to allow more efficient modulation of the optical signal.

The gate dielectric layer 150 establishes a charge modulation region (or charge accumulation region) 155 shown by the dashed box in which free carriers (e.g., electrons and holes) flow into and out of the p-doped and n-doped regions 105 and 110. Doing so creates an active region (defined by $W_{active}$) where the switching function associated with the modulation device 100 (e.g., at switching speeds of 1 Gb/s or greater, such as 10 Gb/s, 28 Gb/s, 40 Gb/s, etc.) can be controlled by a voltage potential applied across the gate dielectric layer 150. In one embodiment, the voltage potential is used to alter the phase of the optical signal propagating through the modulator as in, for example, a Mach-Zehnder interferometer (MZI). However, the modulators described herein may also be used in other types of devices such as ring resonators, Fabry-Perot cavities, etc.

The gate dielectric layer 150 may be referred to as either "gate dielectric" or "gate oxide," where it is to be understood that an oxide is only an exemplary form of a dielectric that may be used in the modulator device. The gate dielectric layer 150 may comprise any material that allows for fast charging/discharging of the free carriers (e.g., enables switching speeds of 1 Gb/s or greater). A non-limiting list of suitable materials include hafnium oxide, oxynitride, bismuth oxide, silicon nitride, silicon oxide, and combinations of these materials. Furthermore, using high-K dielectric materials as the gate dielectric provide higher capacitance and greater charge densities over using dielectrics with lower dielectric constants (assuming same thickness and voltage potential). For example, hafnium oxide and silicon nitride (high-K dielectrics) have higher dielectric constants than silicon dioxide, and thus, enable greater charge densities across the gate dielectric layer relative to using silicon dioxide. Using the higher voltages may increase the modulation efficiency—i.e., the amount the optical signal is phase shifted relative to the amount of voltage applied.

Although the Figures described herein illustrate placing a gate dielectric layer 150 between the opposite doped waveguides, this is not a requirement. For all the embodiments described herein, the modulators may still perform optical modulation if the gate dielectric layer 150 is omitted and the two waveguides directly contact to form a P-N junction. In this example, the P-N junction establishes the charge modulation region where the free carriers flow into and out of the waveguides. However, including the gate dielectric layer 150 may improve the efficiency of the optical modulation.

As shown, the upper region 105 is doped P-type while the lower region 110 is doped N-type. However, for all the embodiments where the dopant type is specified, the dopant types may be reversed—e.g., the upper region 105 may be doped N-type while the lower region 110 is P-type. Furthermore, the regions 105 and 110, which serve as electrodes for the capacitive structure of the modulation device 100, may be silicon based. For example, the material of the regions 105, 110 may include strained silicon, $Si_xGe_{1-x}$, substantially single-crystal silicon (i.e., crystalline silicon), polycrystalline silicon, amorphous silicon, germanium, III-V compounds (such as boron nitride, gallium arsenide, indium arsenide, etc.), as well as combinations thereof. In one embodiment, the lower region 110 may include crystalline silicon while the upper region 105 may be polycrystalline silicon. However, in other embodiments, both regions 105, 110 may be made from crystalline silicon or polycrystalline silicon.

A width of the regions 105, 110 may be selected to keep electrical contacts 125, which may be metallic or formed from silicide, and vias 130 disposed away from the optical mode 160. Because electrically conductive materials may have a deleterious effect on optical modulation, the regions 105, 110 may be designed such that any conductive contacts are sufficiently outside the boundaries of the optical mode 160. Moreover, as shown in FIG. 1, the portions of the regions 105, 110 disposed proximate to the contacts 125 (i.e., silicon portions 115, 140) are more heavily doped than the portions of the regions 105, 110 in which the optical modulation occurs (i.e., silicon portions 120, 145). This arrangement may improve the electrical connection between the silicon-based regions 105, 110 and the contacts 125, thereby decreasing the electrical resistance and related RC time constant associated with the modulation device 100. Moreover, increasingly doped portions of the waveguides disposed proximate to the electrical connection to an external voltage source may be applied to any of the embodiments described herein. Furthermore, the concentration of dopant may increase in the regions 105, 110 as the distance from the optical mode 160 increases. Because the dopant may have a deleterious effect on the optical signal, the dopant concentration in the regions 105, 110 where the optical mode is located may be lightly doped. The dopant concentration may be increased in a step-wise or a substantially continuous manner as the distance from the optical mode increases. Doing so improves the electrical conductivity of the regions 105, 110 and mitigates the negative effect of the dopant on the optical signal. Furthermore, in one embodiment, the electrical contacts 125 are omitted and the vias 130 contact the heavily-doped silicon portions 115, 140 directly.

In one embodiment, the width of the active region (i.e., corresponding to the width of the gate dielectric layer 150) is less than a micron, and more specifically, less than half a micron. The thickness of the regions 105, 110 may range between 50-200 nanometers. In one embodiment, to center the greatest intensity of the light in the optical mode in the charge modulation region, the respective thicknesses of the regions 105, 110 are the same. The thickness of the gate dielectric layer 150 may range from 20 nanometers to 1 or 2 nanometers.

While one simple example of the modulation device 100 is illustrated in FIG. 1, other embodiments may include various alternative geometries that provide a desired performance of the modulation device 100. For example, other embodiments may dispose one of the regions 105, 110 substantially entirely above the other of the regions 105, 110 (i.e., in a vertical arrangement). Other embodiments may also include ridge portions on one or more of the regions 105, 110, which may help to further confine the optical mode 160 and improve efficiency of modulation device 100.

Figure 2:
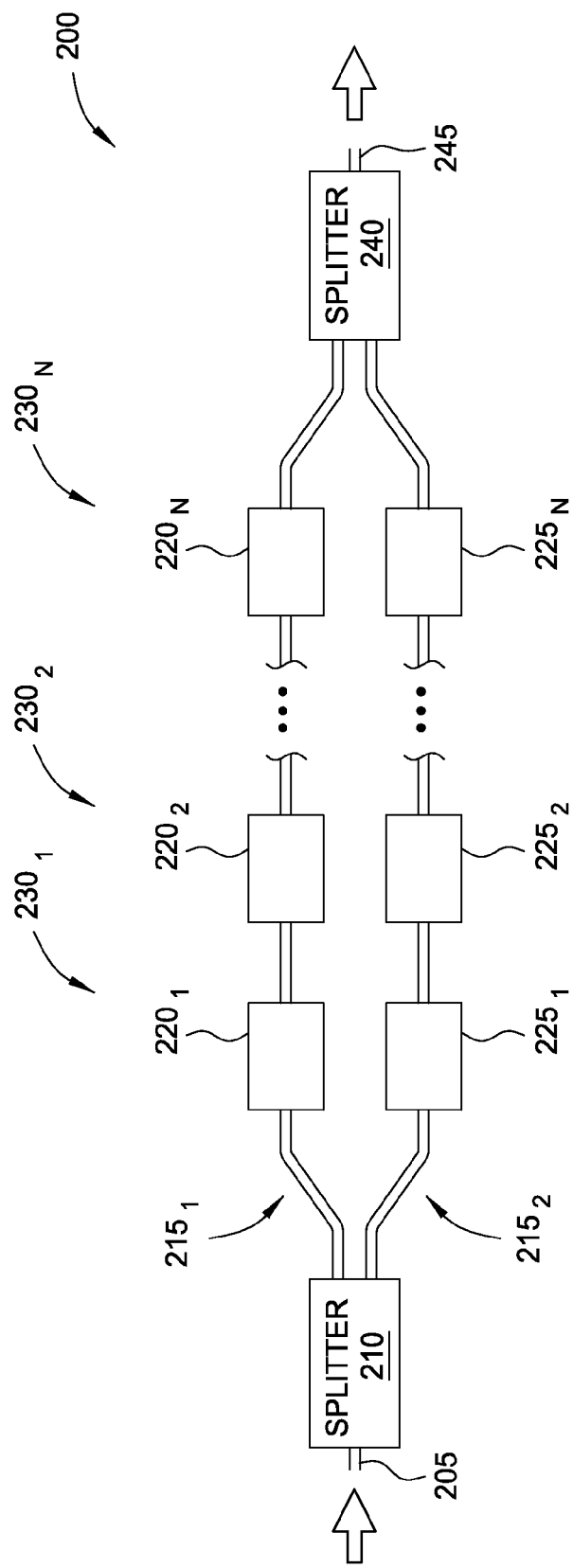
FIG. 2 illustrates a multi-segment electro-optic modulator device, according to embodiments described herein.

FIG. 2 illustrates a multi-segment electro-optic modulation device, according to embodiments described herein. Specifically, FIG. 2 illustrates an MZI-type modulation device 200 that includes an input 205 that receives an optical signal (e.g., a continuous wave signal) and an output 235 that transmits an optical signal that is modulated based on the electrical signals that are used to drive optical modulator segments $220_{1-N}$, $225_{1-N}$. The input 205 includes a y-splitter 210 that splits an incoming continuous wave into each of branches $215_1$, $215_2$. The split optical signals each pass through various modulation segments $220_{1-N}$, $225_{1-N}$ as described above. The modulation segments 220, 225 of each branch 215 may be grouped into pairs 230, such that pair $230_1$ corresponds to modulation segments $220_1$ and $225_1$, pair $230_2$ to modulation segments $220_2$ and $225_2$, and so forth. In one embodiment, at least one of the pairs 230 is used for thermal biasing of the modulation device 200. For example, the modulation device 200 may be DC biased at its quadrature point by providing appropriate signals to the thermal biasing pair(s) to heat the modulation device 200. While N segments are illustrated for each branch $215_1$, $215_2$, differing numbers of modulating segments per branch are also possible. The modulated optical signals from each of the branches 215 are then recombined using a y-splitter 240 to form a modulated output optical signal at output 245. Moreover, the structure shown in modulation device 200 may be used in conjunction with any of the modulators and features disclosed herein. The modulation device 200 may used to provide any suitable multi-level modulation techniques, such as PAM-4, PAM-8, PAM-16, QPSK, QAM, and so forth.

FIGS. 3A and 3B are block diagrams of exemplary modulator drivers, according to embodiments described herein. Generally, driver arrangement 300 illustrates an example high-level functionality of a modulator driver, and driver arrangement 350 illustrates one example implementation of the driver arrangement 300. Although the functionality of driver arrangement 300 is illustrated as a sequence of a plurality of functional stages, alternative embodiments may provide different sequences and/or different functional stages. For example, the functional stages (or portions of the stages) may be performed in a different order, may include additional stages or omit certain stages, and/or may perform certain functional stages contemporaneously. Additionally, various functional stages may be provided as separate integrated circuits, or some or all of the functional stages included within a common integrated circuit.

As shown, driver arrangement 300 receives a differential input signal 302. Generally, differential signaling is a method of transmitting information electrically using two complementary signals sent on two paired wires or traces (called a differential pair). Because external signal interference, such as noise, tends to affect both wires in a similar manner, and because the transmitted information is contained in the difference between the complementary signals, differential signaling generally offers an improved immunity to electromagnetic noise when compared with single-ended signaling. Generally, single-ended signaling transmits information using one signal relative to an unpaired reference voltage (e.g., ground). The noise immunity of differential signaling may be advantageous for use with low-voltage, high-speed electronics systems, such as modern communications systems. The differential input signal 302 may be an analog signal or digital. The differential input signal 302 may correspond to a particular communications standard, some examples of which include RS-232, RS-422, RS-485, Ethernet over twisted pair, PCI Express, DisplayPort, HDMI, and USB.

In many cases, the modulator may require particular signal characteristics at its input that do not match the characteristics of the data included in the differential input signal 302 (e.g., which may be dictated by a communications standard). In some embodiments, the modulation efficiency of the modulator depends on a voltage output range provided by the circuitry of the driver arrangement. For example, a certain configuration of a SISCAP device may exhibit a large increase in modulation efficiency for voltages greater than 1 volt (V). Driving the SISCAP device with higher voltages may increase a net capacitance of the device, improving control of the RC bandwidth for modulation purposes. Thus, a driver arrangement producing a voltage swing of 1V may be better suited for driving a SISCAP device when configured to output a voltage above 1V (say, between 1.2V-2.2V) than between 0 and 1V.

At the conversion stage 304, the differential input signal 302 is converted by driver circuitry to produce a complementary CMOS signal. Among other functions, conversion may include various stages of amplification of the differential input signal. In one embodiment, the conversion stage 304 provides a rail-to-rail complementary CMOS output signal. The information included in the complementary CMOS signal may be further processed in a processing stage 306, and the resulting signal may be amplified in an amplification stage 308 to generate a complementary CMOS output signal 310 suitable for driving a modulator. The amplification stage 308 may include a number of stages of amplifier circuitry that collectively boost the output signal into a desired voltage range for operating the modulator. In some embodiments, performing the processing stage 306 prior to the output amplification stage 308 allows the dimensions of the processing stage circuitry to be significantly smaller than if the same processing functions were performed on the output signal 310.

Driver arrangement 350 provides one example of the driver arrangement 300. A current-mode logic (CML) input signal 352 is received at a CML-to-CMOS conversion stage 354 of the driver arrangement 350. CML is one type of differential digital logic family, generally configured to transmit data at rates of up to 40 gigabits per second (Gb/s) and higher using printed circuit boards. CML is commonly used in the design of high-speed electronic systems due to a relatively small output voltage swing and a relative fast current switching. As with other logic families, CML may specify additional requirements, such as termination circuitry (discussed further below). In one embodiment, the CML-to-CMOS conversion stage 354 includes a differential amplifier whose output is coupled with at least one transimpedance amplifier (TIA). In one embodiment, the CML-to-CMOS conversion stage 354 includes one or more amplification stages following the TIA(s) to boost the signal to a rail-to-rail complementary CMOS output signal suitable for driving a CMOS-based modulator.

The output signal from the CML-to-CMOS conversion stage may have additional processing performed before being amplified to desired output levels for the modulator. As shown, a data multiplexing stage 356 allows the output signal data to be changed during operation. For example, the data multiplexing stage 356 may allow a test signal or other desired signal to be selected for output to the modulator. Following the data multiplexing stage 356, the signal is amplified at output amplification stage 358 to an output signal 360 having an output range suitable for driving the CMOS-based modulator.

Figure 4:
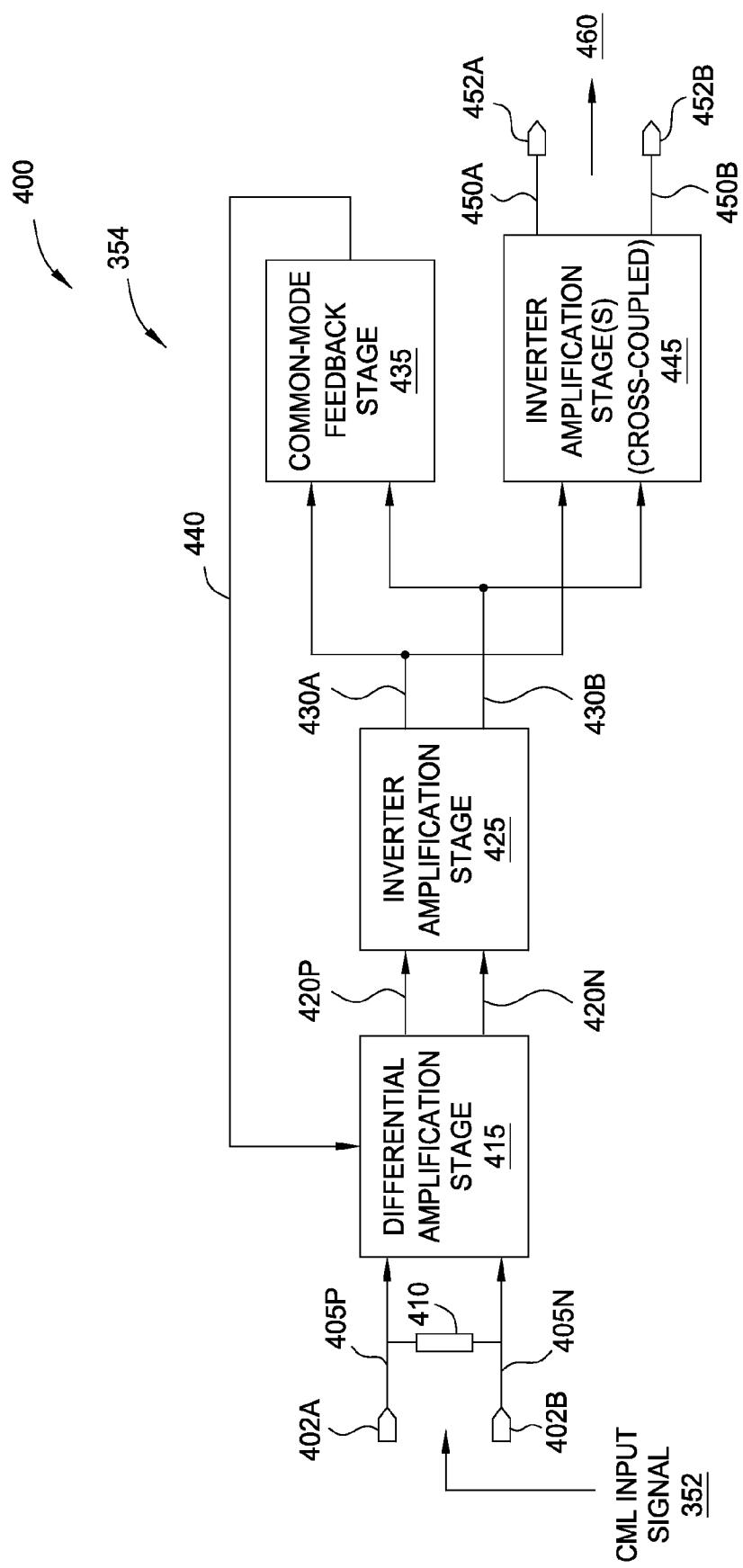
FIG. 4 is a block diagram of an exemplary conversion stage of a modulator driver, according to embodiments described herein.

FIG. 4 is a block diagram of an exemplary conversion stage of a modulator driver, according to embodiments described herein. The conversion stage 400 generally corresponds to the CML-to-CMOS conversion stage 354.

The CML input signal 352 is received at differential inputs 402A, 402B. The differential signals 405P, 405N corresponding to the CML input signal 352 pass through termination circuitry 410 prior to being received at the differential amplification stage 415. For example, according to CML requirements, the termination circuitry 410 may include a 50 ohm resistor for each differential input 402, as well as a pull-up to a reference voltage (such as $V_{DD}$). Of course, other configurations of termination circuitry may be possible with other types of differential input signals.

The differential signals 405P, 405N are received at the differential amplification stage 415 and amplified. The output signals 420P, 420N from the differential amplification stage 415 are provided to a first inverter amplification stage 425. In one embodiment, the inverter amplification stage 425 includes one or more TIAs. In one embodiment, the inverter amplification stage 425 includes one TIA applied to each input signal 420P, 420N. Outputs of the first inverter amplification stage 425 are signals 430A and 430B. Each of the signals 430A, 430B is provided to a common-mode feedback stage 435 and to a second inverter amplification stage 445. Based on the signals 430A, 430B, the common-mode feedback stage 435 outputs a control signal 440 to the differential amplification stage 415. The control signal 440 is used to control the biasing of the inverter amplification stage 425 by modifying properties of the output signals 420P, 420N.

The second inverter amplification stage 445 includes one or more stages of inverters, some of which may include cross-coupled inverters. The output signals 450A, B from the second inverter amplification stage 445 are provided to outputs 452A, 452B and collectively are considered output signal 460. In one embodiment, the output signal 460 from the conversion stage 400 is a rail-to-rail complementary CMOS signal, having an output range suitable for driving a CMOS-based modulator.

Figure 5:
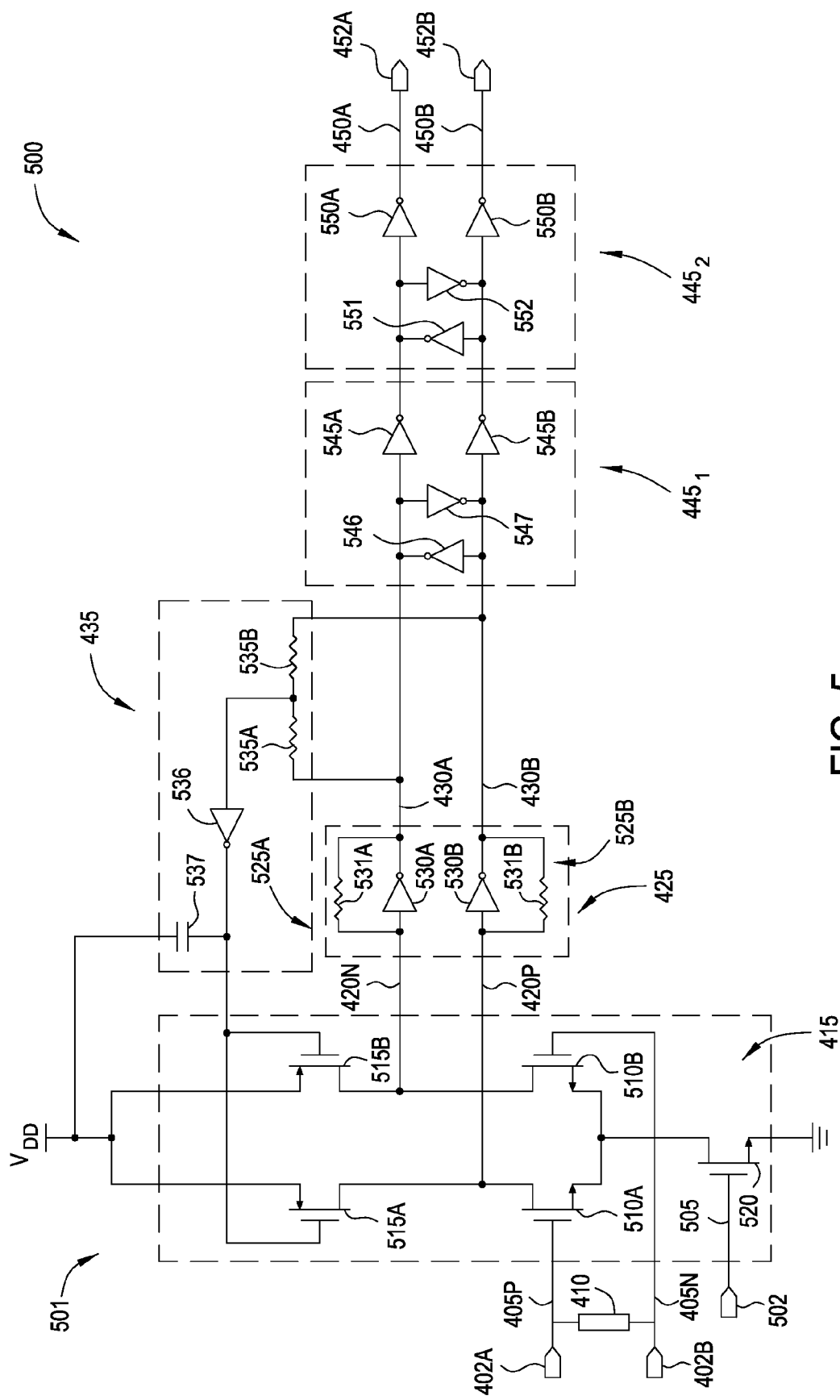
FIG. 5 is a schematic view of an exemplary conversion stage of a modulator driver, according to embodiments described herein.

FIG. 5 is a schematic view of an exemplary conversion stage of a modulator driver, according to embodiments described herein. Generally, the conversion arrangement 500 corresponds to one possible implementation of the conversion stage 400.

A differential input signal (such as the CML input signal 352) is received at differential inputs 402A, 402B. The inputs 402A, 402B may be conductive contacts, such as wires, pads, or traces. As described above, the differential signals 405P, 405N may pass through termination circuitry 410 prior to being received at the differential amplification stage 415.

The differential amplification stage 415 includes a differential amplifier 501 that includes a first pair of MOS devices (i.e., transistors 510A, 510B) having a first conductivity type (i.e., n-channel), with each of the first pair of MOS devices configured to receive one differential signal of the differential input signal. Generally, the first pair of MOS devices may also be referred to as a differential pair. The differential pair generally offers some noise immunity and common mode rejection, which results in an increased input sensitivity that is suitable for small input signals. The differential amplifier 501 also includes a second pair of MOS devices (i.e., transistors 515A, 515B) having a different conductivity type (i.e., p-channel). Each of the second pair of MOS devices generally operates as a current source load for a respective MOS device of the first pair. For example, transistor 515A is coupled with transistor 510A, and 515B with 510B. The differential amplifier 501 also includes another MOS device (i.e., transistor 520) coupled with the sources of transistors 510A, 510B and which may be operated as a current source. Operation of the transistor 520 may be controlled using a biasing signal 505 applied at an input 502, which is coupled with the gate of transistor 520. Outputs of the differential amplifier 501 are signals 420P, 420N, representing the common mode output of the differential pair and provided at the respective drains of the transistors 510A, 510B.

The output signals 420P, 420N are received at a first inverter amplification stage 425. As shown, the first inverter amplification stage 425 includes a transimpedance amplifier (TIA) 525A coupled with one output of the differential amplifier 501, and a TIA 525B coupled with the other output of the differential amplifier. Each TIA 525A, 525B includes a respective inverter 530 and feedback resistor 531. The first inverter amplification stage 425 is generally configured to produce a second amplified signal (i.e., signals 430A, 430B) that is based on the first amplified signal (i.e., signals 420N, 420P). Because the input and output of each TIA 525 is coupled through the respective feedback resistor 531, the input and common mode output of the TIAs may be controlled to have voltage values close to a trip point of the inverter 530.

If the output of the differential pair is coupled directly with CMOS inverters (such as those included in the second inverter amplification stage(s) 445), without first passing through the TIAs 525 of the first inverter amplification stage 425, process-dependent voltage offsets would develop between the differential pair common mode output (reflected in signals 420N, 420P) and the trip points of the CMOS inverters. The voltage offsets would limit the gain available at the first CMOS inverter, and this undesired effect may be magnified along the chain of successive inverters. The effect of the voltage offsets may significantly impact the operation of the modulator, or in some cases may completely squelch the outputs of the modulator driver.

In some embodiments, the voltage offsets are mitigated by measuring the common mode at the output of the TIAs 525 (i.e., signals 430A, 430B), and by comparing the common mode with the trip point of an inverter amplifier. A feedback or control signal based on the difference value (e.g., may optionally be filtered) may be provided to the current source loads of the differential amplifier 501 (i.e., transistors 515A, 515B) to adjust the common mode output of the differential pair. Adjustments made by the control signal to the differential pair common mode output are propagated to the input of the TIAs 525, which in turn adjusts the bias of the TIAs to follow the trip point of the inverter 530. In some embodiments, the common mode output of the TIAs is select to have voltage values close to the trip point of a successive inverter in the sequence (e.g., inverters 545A, 545B of the amplification stage $445_1$), which results in a large gain to be available at the successive inverter, with nearly full rail-to-rail CMOS output levels produced by the successive inverter.

As shown, the common-mode feedback stage 435 includes resistors 535A, 535B that are each coupled with the output of a respective TIA 525, as well as with an input of an inverter 536. The control signal may include one or more components for filtering or conditioning the control signal. The output of inverter 536 may have a capacitor 537 connected with voltage source $V_{DD}$ in order to perform frequency compensation.

In one embodiment, the (conditioned) control signal is coupled with the gates of the p-channel transistors 515A, 515B. In one embodiment, the characteristics of resistors 535A, 535B and/or inverter 536 are selected to provide a desired control signal. In one embodiment, the control signal is selected so that in a quiescent condition, the currents traveling through each of transistors 515A, 515B equal the current through the corresponding transistor 510A, 510B. In other words, no current is flowing into the TIAs 525, which causes no voltage drop across the TIAs, and the trip point of the inverters 530 is not disturbed.

The signals 430A, 430B are also provided to second inverter amplification stages $445_1$, $445_2$ which as shown include cross-coupled inverters 546, 547 and 551, 552. The output signals 450A, 450B from the second inverter amplification stage 445 are provided to outputs 452A, 452B and collectively are considered output signal 460. In one embodiment, the output signal 460 from the conversion stage 400 is a rail-to-rail complementary CMOS signal, having an output range suitable for driving a CMOS-based modulator.

Within this configuration, the common mode outputs of the differential amplifier 501 and the TIAs 525 may be held at the same levels, irrespective of a common-mode level of the input signal, and despite any variations in process, supply voltage, or temperature (PVT). Moreover, in some embodiments, all of the inverters are matched so that successive inverters (e.g., the inverters 545A, 545B, 550A, 550B) which operate as large signal drivers are also biased near their trip points. This configuration offers a greater common mode rejection than circuits with conventional differential stages having resistive or current source loads. Accordingly, the greater common mode rejection allows the driver arrangement to produce more symmetric optical eyes across PVT corners.

Because the input impedance of the TIAs 525 is relatively small, any voltage excursions occurring at the output of the differential pair are also fairly small. Accordingly, variation in the currents through the transistors 510A, 510B, 515A, 515B caused by channel length modulation (which is a function of the input signal amplitude) is also relatively small. The inverter's bias points are also substantially unaffected by the voltage excursions. Additionally, the relatively low input impedance corresponds to a greater bandwidth supported by the driver arrangement. In contrast, certain CML-to-CMOS converters provide a much smaller bandwidth for the same amount of power dissipation, and a smaller bandwidth generally results in more inter-symbol interference (ISI) in transmitted optical data. Successive inverters in the amplification chain may be driven rail-to-rail, thereby minimizing any excessive power needed to maintain a minimum headroom (e.g., alternative amplifier designs).

Figure 6A:
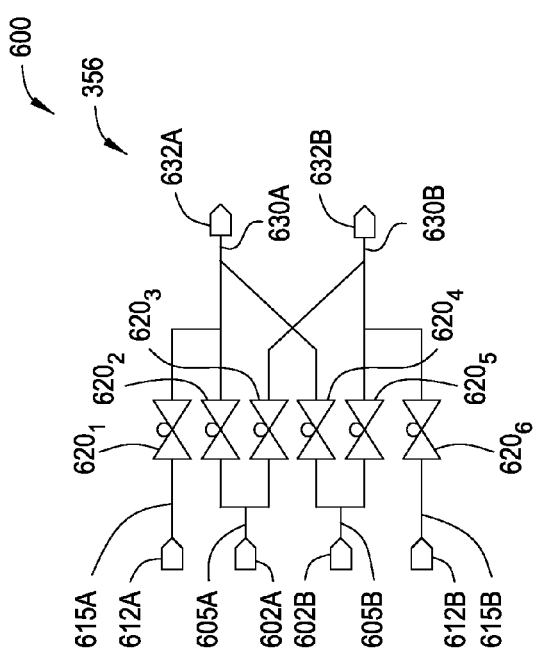
FIG. 6A is a schematic view of an exemplary data multiplexing stage of a modulator driver, according to embodiments described herein.

FIG. 6A is a schematic view of an exemplary data multiplexing stage of a modulator driver, according to embodiments described herein. Specifically, the arrangement 600 provides one possible implementation of the data multiplexing stage 356 of the driver arrangement 350. In one embodiment, the data multiplexing stage is configured to receive an output signal of a previous stage of the driver arrangement.

Arrangement 600 includes a number of inputs 602A, 602B, 612A, and 612B. The inputs 602A, 602B are conductive contacts that are configured to be coupled with outputs from the previous stage. In one embodiment, inputs 602A, 602B are coupled with outputs 452A, 452B (see FIG. 5), so that the output signals 450A, 450B produced at outputs 452A, 452B are the same as input signals 605A, 605B. Inputs 612A, 612B are conductive contacts that are configured to be driven with alternative signals 615A, 615B. In one embodiment, the alternative signals 615 include a test signal for the modulator.

The arrangement 600 includes a number of switches $620_{1-6}$ that selectively couple one of the inputs 602, 612 with one of the outputs 632. For example, in a first mode of operation, switches $620_2$ and $620_5$ are activated to couple inputs 602A, 602B with outputs 632A, 632B. In a second mode of operation, switches $620_3$ and $620_4$ are activated to invert the polarity of the outputs, so that inputs 602A, 602B are coupled with respective outputs 632B, 632A. In a third mode of operation, switches $620_1$ and $620_6$ are activated to couple the inputs 612A, 612B with the outputs 632A, 632B. Of course, other types of multiplexing are possible.

In some embodiments, it may be preferable to include the data multiplexing stage 356 prior to the performing the output amplification stage 358. For example, operating on the pre-amplified signals allows the dimensions of the components of arrangement 600 to be significantly smaller than if the same functions were performed on the fully amplified output signal.

Figure 6B:
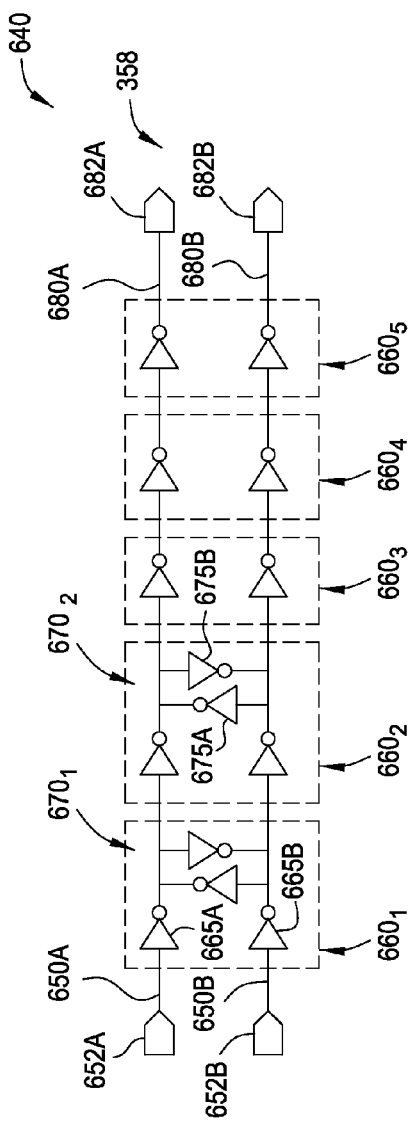
FIG. 6B is a schematic view of an exemplary output amplification stage of a modulator driver, according to embodiments described herein.

FIG. 6B is a schematic view of an exemplary output amplification stage of a modulator driver, according to embodiments described herein. Specifically, the arrangement 640 provides one possible implementation of the output amplification stage 358 of the driver arrangement 350. In one embodiment, the output amplification stage is configured to receive an output signal of a previous stage of the driver arrangement, such as a conversion stage or a data multiplexing stage.

Arrangement 640 includes inputs 652A, 652B configured to receive input signals 650A, 650B. The arrangement includes a plurality of amplification stages $660_1$-$660_5$, each of which includes a pair of inverters 665A, 665B. Additionally, some of the amplification stages (i.e., $660_1$, $660_2$) include portions $670_1$, $670_2$ having cross-coupled inverters 675A, 675B, while other amplification stages do not include these portions. The cross-coupled inverters may be provided to ensure that the amplified intermediate signals (based on input signals 650A, 650B) track each other to a desired degree. After several stages of amplification, the output signals 680A, 680B are provided to outputs 682A, 682B, which in some cases represents the final output signal of the driver arrangement 350 (i.e., output signal 360).

Figure 7:
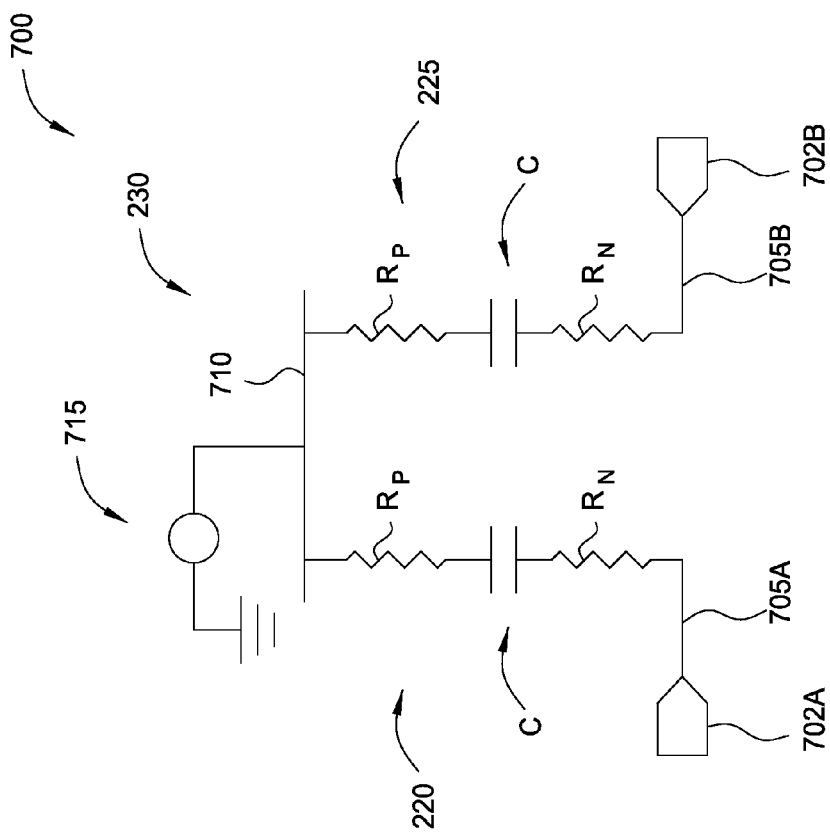
FIG. 7 is a schematic view of a modulator segment coupled with outputs of an exemplary modulator driver, according to embodiments described herein.

FIG. 7 is a schematic view of a modulator segment coupled with outputs of an exemplary modulator driver, according to embodiments described herein. Specifically, the view 700 represents an electrical equivalent model of a pair 230 of modulator segments 220, 225 of a SISCAP modulator device.

Each modulator segment 220, 225 includes a resistance $R_P$ that represents the resistance of the P-type region of the SISCAP device (e.g., region 105 of FIG. 1), and a resistance $R_N$ representing the resistance of the N-type region (e.g., region 110). The resistances $R_P$, $R_N$ of each modulator segment are coupled through a capacitance C, which generally represents the capacitance across a gate oxide, gate dielectric, or P-N junction of the SISCAP device.

During operation of the modulator, different portions of the modulator may be driven at different voltages. In one example, electrical contacts on the P-type regions of each of the modulator segments may be driven with the same voltage (represented by connection 710) while the electrical contacts of the N-type regions are driven with a data signal. In one embodiment, a voltage source 715 is applied to the connection 710. In one embodiment, the voltage source 715 provides a DC voltage to the connection 710, such as about 2.2 V.

As shown, the electrical contacts of the N-type region are coupled with inputs 702A, 702B. The signals 705A, 705B corresponding to each input 702 generally represent the amplified output signal driven by a driver arrangement, such as the driver arrangement 350. As such, the signals 705A, 705B generally represent the full rail-to-rail data signal and its complement. That is, if signal 705A corresponds to the data signal driven by the driver arrangement (DATA), signal 705B corresponds to the logical complement of the data (NOT DATA, DATA*, etc.). In one embodiment, each of the signals 705A, 705B are driven with a rail-to-rail voltage between 0 and 1 V. In one embodiment, when signals 705A, 705B are applied to inputs 702A, 702B, the voltage across the modulator segments 220, 225 varies between 1.2V (i.e., 2.2V-1V) and 2.2V (i.e., 2.2 V-0), which corresponds to the range of increased modulation efficiency for the SISCAP modular device. Of course, configurations may be varied based on the particular characteristics of the modulator device, such as different values of voltage source 715 and the output voltages from the driver arrangement.

Figure 8:
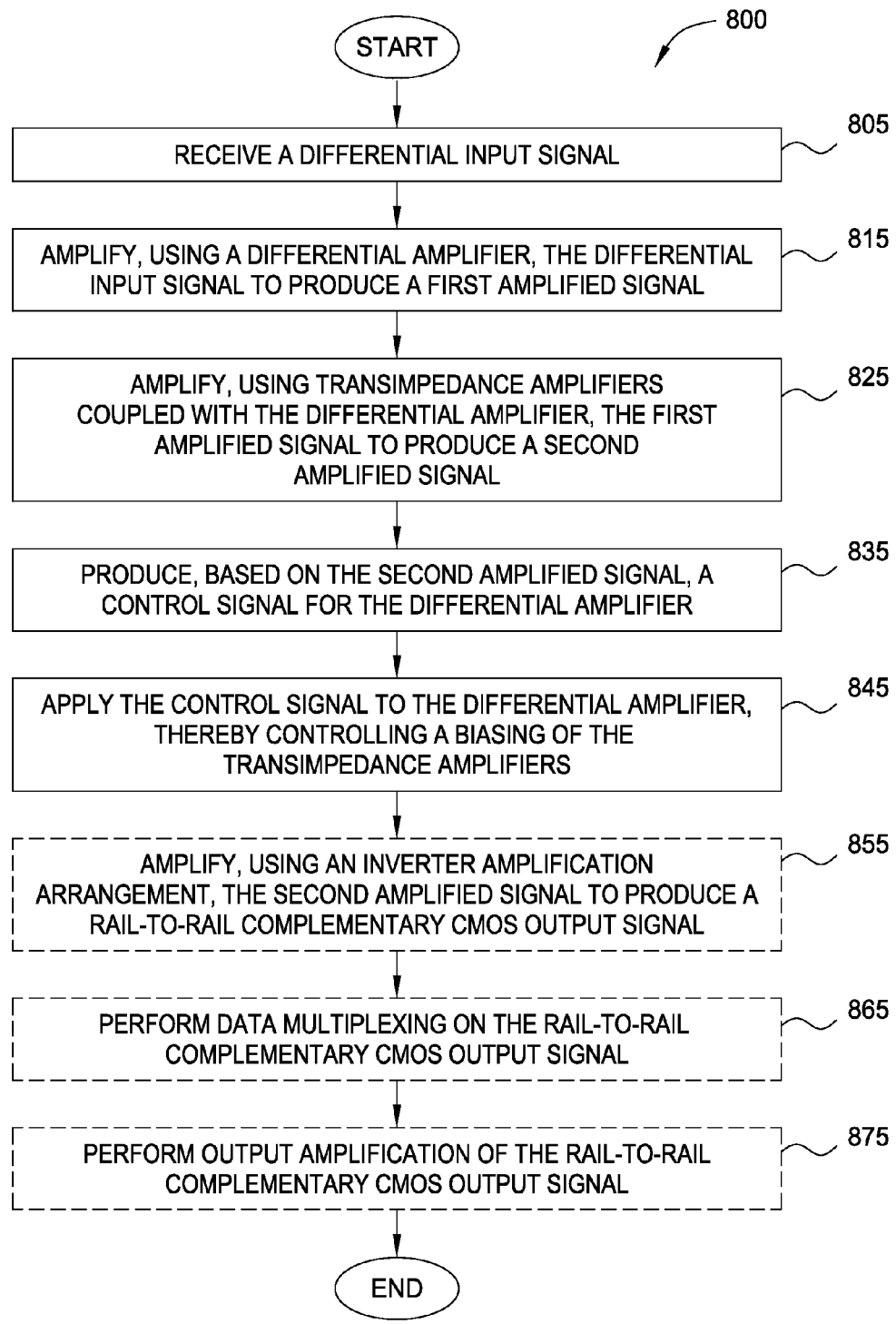
FIG. 8 is a method of producing a complementary complementary metal-oxide-semiconductor (CMOS) output signal for driving a modulator device, according to embodiments described herein.

FIG. 8 is a method of producing a complementary CMOS output signal for driving a modulator device, according to embodiments described herein. The method 800 may be performed by various components of a driver arrangement, such as those described above.

Method 800 begins at block 805, where the driver arrangement receives a differential input signal. In one embodiment, the differential input signal may be provided according to a particular communications standard, such as CML.

At block 815, the differential input signal is amplified using a differential amplifier to produce a first amplified signal. In one embodiment, the differential input signal is amplified using a differential pair of MOS devices. In one embodiment, the first amplified signal represents a common mode output of the differential amplifier.

At block 825, the first amplified signal is amplified using a first amplification arrangement to produce a second amplified signal. In one embodiment, the first amplification arrangement includes at least a first transimpedance amplifier (TIA) coupled with an output of the differential amplifier. In one embodiment, a respective TIA is coupled with each output of the differential amplifier. In one embodiment, the bias voltage for the first TIA is based on the first amplified signal.

At block 835, a control signal for the differential amplifier is produced based on the second amplified signal. In one embodiment, the control signal is generated using a common-mode feedback arrangement coupled with an output of the TIA(s). In one embodiment, the common-mode feedback arrangement includes resistances coupled with each output of the TIA(s) and with an input of an inverter. In one embodiment, the common-mode feedback arrangement includes one or more components for filtering and/or conditioning the control signal.

At block 845, the control signal is applied to the differential amplifier, thereby controlling a biasing of the first inverter amplification arrangement. In one embodiment, the control signal is provided to the gates of MOS devices coupled with the differential pair, such as current loads having a different conductivity type. For example, if the differential pair includes n-channel MOS devices, the current loads may be p-channel MOS devices. The adjustments caused by the control signal to the differential pair common mode output are propagated to the input of the TIAs, which in turn adjusts the bias of the TIA to follow the trip point of the associated inverter.

At block 855, the second amplified signal is optionally amplified using an inverter amplification arrangement. In one embodiment, block 855 occurs contemporaneously with blocks 835 and 845. In one embodiment, the second inverter amplification arrangement is included within a conversion stage of the driver arrangement, and includes one or more stages of amplification, some stages of which may include cross-coupled inverters. In one embodiment, a rail-to-rail complementary CMOS output signal is produced from the conversion stage.

At block 865, data multiplexing is optionally performed on the complementary CMOS output signal. Data multiplexing may include changing the polarity of the signal, or including a test signal or other alternative signal.

At block 875, output amplification is optionally performed on the complementary CMOS output signal. The output amplification may be performed to boost the intermediate output signal to a preferred voltage range for driving the associated modulator.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The flowchart and block diagrams in the figures illustrate the architecture, functionality, and operation of possible implementations of systems or methods according to various embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

In view of the foregoing, the scope of the present disclosure is determined by the claims that follow.

We claim:

1. A conversion arrangement for converting a differential input signal to a complementary metal-oxide-semiconductor (CMOS) output signal, the conversion arrangement comprising:
   a differential amplifier configured to produce a first amplified signal based on the differential input signal, wherein the differential amplifier includes:
      a first pair of MOS devices having a first conductivity type, each MOS device of the first pair configured to receive one differential input of the differential input signal; and
      a second pair of MOS devices having a second conductivity type, each MOS device of the second pair operating as a current source load for a respective MOS device of the first pair;
   at least two transimpedance amplifiers (TIAs) coupled with respective differential outputs of the differential amplifier and configured to produce a second amplified signal based on the first amplified signal, wherein respective bias voltages for the at least two TIAs are based on the first amplified signal; and
   a common-mode feedback arrangement coupled with outputs of the at least two TIAs and configured to control the first amplified signal based on the second amplified signal, wherein the common-mode feedback arrangement is coupled with a gate of each MOS device of the second pair in the differential amplifier to control the first amplified signal, and
   wherein the CMOS output signal is based on the second amplified signal.

2. The conversion arrangement of claim 1, further comprising an inverter amplification arrangement coupled with an output of the TIAs and configured to produce a rail-to-rail CMOS output signal based on the second amplified signal.

3. The conversion arrangement of claim 2, wherein the inverter amplification arrangement includes one or more cross-coupled inverter stages.

4. The conversion arrangement of claim 1, wherein the differential input signal is a current-mode logic (CML) signal.

5. The conversion arrangement of claim 1, wherein each of the at least two TIAs includes a respective inverter.

6. The conversion arrangement of claim 5, wherein each of the bias voltages is controlled to approximately equal a trip point of the respective inverter.

7. A driver arrangement configured to receive a differential input signal and to produce a complementary metal-oxide-semiconductor (CMOS) output signal for driving a modulator device, the driver arrangement comprising:
a conversion arrangement configured to:
amplify, at a differential amplification stage, the differential input signal to produce a first amplified signal, wherein the differential amplification stage includes:
a first pair of MOS devices having a first conductivity type, each MOS device of the first pair configured to receive one differential input of the differential input signal; and
a second pair of MOS devices having a second conductivity type, each MOS device of the second pair operating as a current source load for a respective MOS device of the first pair;
amplify, using at least two transimpedance amplifiers (TIAs) coupled with respective differential outputs of the differential amplification stage, the first amplified signal to produce a second amplified signal, wherein respective bias voltages for the at least two TIAs are based on the first amplified signal; and
produce, based on the second amplified signal and using a feedback arrangement coupled with the differential amplification stage, a control signal for the differential amplification stage, wherein the feedback arrangement is coupled with a gate of each MOS device of the second pair in the differential amplification stage to control the first amplified signal, and
wherein application of the control signal to the differential amplification stage operates to control the bias voltages for the TIAs.

8. The driver arrangement of claim 7, wherein the conversion arrangement is further configured to, at a second inverter amplification stage coupled with an output of the TIAs, produce a rail-to-rail CMOS output signal based on the second amplified signal.

9. The driver arrangement of claim 7, further comprising a data multiplexing arrangement coupled with an output of the conversion arrangement.

10. The driver arrangement of claim 7, further comprising an output amplification stage coupled with an output of the conversion arrangement.

11. The driver arrangement of claim 7, wherein the differential input signal is a current-mode logic (CML) signal.

12. The driver arrangement of claim 7, wherein the modulator device is a silicon-insulator-silicon capacitor (SISCAP) device.

13. The driver arrangement of claim 7,
wherein each of the at least two TIAs includes a respective inverter, and
wherein each of the bias voltages is controlled to approximately equal a trip point of the respective inverter.

14. A method of producing a complementary metal-oxide-semiconductor (CMOS) output signal for driving a modulator device, the method comprising:
receiving a differential input signal;
amplifying, using a differential amplifier, the differential input signal to produce a first amplified signal, wherein the differential amplifier includes:
a first pair of MOS devices having a first conductivity type, each MOS device of the first pair configured to receive one differential input of the differential input signal; and
a second pair of MOS devices having a second conductivity type, each MOS device of the second pair operating as a current source load for a respective MOS device of the first pair;
amplifying, using transimpedance amplifiers (TIAs) coupled with respective outputs of the differential amplifier, the first amplified signal to produce a second amplified signal, wherein respective bias voltages for the TIAs are based on the first amplified signal;
producing, based on the second amplified signal and using a feedback arrangement coupled with the differential amplifier, a control signal for the differential amplifier, wherein the feedback arrangement is coupled with a gate of each MOS device of the second pair in the differential amplifier to control the first amplified signal; and
applying the control signal to the differential amplifier, thereby controlling the bias voltages for the TIAs,
wherein the CMOS output signal is based on the second amplified signal.

15. The method of claim 14, further comprising:
amplifying, using an inverter amplification arrangement coupled with an output of the TIAs, the second amplified signal to produce a rail-to-rail CMOS output signal.

16. The method of claim 15, wherein the amplification using the differential amplifier, the TIAs, and the inverter amplification arrangement is performed within a conversion stage to produce the rail-to-rail CMOS output signal, the method further comprising, in one or more separate stages, one or more of:
performing data multiplexing on the rail-to-rail CMOS output signal; and
performing an output amplification of the rail-to-rail CMOS output signal.

17. The method of claim 14, wherein the differential input signal is a current-mode logic (CML) signal.

18. The method of claim 14, wherein the modulator device is a silicon-insulator-silicon capacitor (SISCAP) device.

19. The method of claim 14, wherein each of the TIAs includes a respective inverter, and
wherein each of the bias voltages is controlled to approximately equal a trip point of the respective inverter.

* * * * *